US012255045B2

(12) United States Patent
Tiemeijer (10) Patent No.: US 12,255,045 B2
(45) Date of Patent: Mar. 18, 2025

(54) TRANSMISSION CHARGED PARTICLE MICROSCOPE WITH AN ELECTRON ENERGY LOSS SPECTROSCOPY DETECTOR

(71) Applicant: FEI Company, Hillsboro, OR (US)

(72) Inventor: Peter Christiaan Tiemeijer, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 18/629,633

(22) Filed: Apr. 8, 2024

(65) Prior Publication Data

US 2024/0258067 A1    Aug. 1, 2024

Related U.S. Application Data

(62) Division of application No. 17/214,719, filed on Mar. 26, 2021, now Pat. No. 11,955,310.

(30) Foreign Application Priority Data

Mar. 31, 2020  (EP) ..................................... 20167235

(51) Int. Cl.
*H01J 37/28* (2006.01)
*H01J 37/10* (2006.01)
(Continued)

(52) U.S. Cl.
CPC .............. *H01J 37/28* (2013.01); *H01J 37/10* (2013.01); *H01J 37/1474* (2013.01);
(Continued)

(58) Field of Classification Search
CPC .. H01J 37/00; H01J 37/02; H01J 37/26; H01J 37/28; H01J 37/10; H01J 37/1474;
(Continued)

(56) References Cited

U.S. PATENT DOCUMENTS 9,978,561 B2   5/2018 Henstra et al.
10,224,174 B1  3/2019 Freitag et al.
(Continued)

OTHER PUBLICATIONS

Craven et al., "Getting the most out of a post-column EELS spectrometer on a TEM/STEM by optimizing the optical coupling," Ultramicroscopy, 18:66-80, Apr. 1, 2017. (Year: 2017).*
(Continued)

*Primary Examiner* — Jason L McCormack
(74) *Attorney, Agent, or Firm* — Klarquist Sparkman, LLP (57) ABSTRACT

The invention relates to a transmission charged particle microscope comprising a charged particle beam source for emitting a charged particle beam, a sample holder for holding a sample, an illuminator for directing the charged particle beam emitted from the charged particle beam source onto the sample, and a control unit for controlling operations of the transmission charged particle microscope. As defined herein, the transmission charged particle microscope is arranged for operating in at least two modes that substantially yield a first magnification whilst keeping said diffraction pattern substantially in focus. Said at least two modes comprise a first mode having first settings of a final projector lens of a projecting system; and a second mode having second settings of said final projector lens.

9 Claims, 7 Drawing Sheets

(51) Int. Cl.
  *H01J 37/147* (2006.01)
  *H01J 37/20* (2006.01)
  *H01J 37/26* (2006.01)

(52) U.S. Cl.
  CPC ............ *H01J 37/20* (2013.01); *H01J 37/265* (2013.01); *H01J 2237/24485* (2013.01); *H01J 2237/2802* (2013.01); *H01J 2237/31749* (2013.01)

(58) Field of Classification Search
  CPC ........ H01J 37/20; H01J 37/265; H01J 37/244; H01J 2237/24485; H01J 2237/2802; H01J 2237/31749; H01J 2237/0492
  USPC .......................................... 250/306, 307, 311
  See application file for complete search history.

(56) References Cited

U.S. PATENT DOCUMENTS

| | | |
|---|---|---|
| 10,559,448 B2 | 2/2020 | Henstra et al. |
| 2004/0169142 A1 | 9/2004 | Yamanaka et al. |
| 2005/0285037 A1 | 12/2005 | Nakamura et al. |
| 2006/0011836 A1 | 1/2006 | Kaji et al. |
| 2006/0151701 A1* | 7/2006 | Tsuneta ............... H01J 37/1474 250/310 |
| 2011/0220791 A1* | 9/2011 | Reed ...................... H01J 37/26 250/311 |
| 2013/0126729 A1 | 5/2013 | Own et al. |
| 2015/0029593 A1* | 1/2015 | Sawada .................. G01N 23/20 359/637 |
| 2016/0276130 A1 | 9/2016 | Mele et al. |
| 2018/0342366 A1 | 11/2018 | Ogasawara et al. |
| 2021/0305013 A1 | 9/2021 | Tiemeijer |

OTHER PUBLICATIONS

Craven et al., "Getting the most out of a post-column EELS spectrometer on a TEM/STEM by optimizing the optical coupling," *Ultramicroscopy*, 18:66-80 (Apr. 1, 2017).

Extended Search Report for related EP Application No. 20167235.9, 9 pages, mailed Sep. 11, 2020.

* cited by examiner

TRANSMISSION CHARGED PARTICLE MICROSCOPE WITH AN ELECTRON ENERGY LOSS SPECTROSCOPY DETECTOR

CROSS REFERENCE TO RELATED APPLICATION

This application is a divisional of U.S. patent application Ser. No. 17/214,719, filed Mar. 26, 2021, now U.S. Pat. No. 11,955,310, and is incorporated herein by reference.

BACKGROUND OF THE INVENTION

Charged particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as a so-called "dual-beam" apparatus (e.g. a FIB-SEM) that additionally employs a Focused Ion Beam (FIB), allowing supportive activities such as ion-beam milling or Ion-Beam-Induced Deposition (IBID). The skilled person will be familiar with the different species of charged particle microscopy.

Irradiation of a sample by a scanning electron beam precipitates emanation of "auxiliary" radiation from the sample, in the form of secondary electrons, backscattered electrons, X-rays and cathodoluminescence (infrared, visible and/or ultraviolet photons). One or more components of this emanating radiation may be detected and used for sample analysis.

One way of analyzing a sample is to make use of an Electron Energy-Loss Spectroscopy (EELS) module. In Electron Energy Loss Spectroscopy (EELS) a material is exposed to a beam of electrons with a known, narrow range of kinetic energies. Some of the electrons will undergo inelastic scattering, which means that they lose energy and maybe have their paths slightly deflected. The amount of energy loss can be measured via an electron spectrometer and interpreted in terms of what caused the energy loss. Inelastic interactions include phonon excitations, inter- and intra-band transitions, plasmon excitations, inner shell ionizations, and Cherenkov radiation. The inner-shell ionizations are particularly useful for detecting the elemental components of a material. For example, one might find that a larger-than-expected number of electrons comes through the material with 285 eV less energy than they had when they entered the material. This is approximately the amount of energy needed to remove an inner-shell electron from a carbon atom, which can be taken as evidence that there is a significant amount of carbon present in the sample. With some care, and looking at a wide range of energy losses, one can determine the types of atoms, and the numbers of atoms of each type, being struck by the beam. The scattering angle (that is, the amount that the electron's path is deflected) may also be measured, giving information about the dispersion relation of whatever material excitation caused the inelastic scattering.

There are several basic flavors of EELS, primarily classified by the geometry and by the kinetic energy of the incident electrons (typically measured in kiloelectron-volts, or keV). Probably the most common today is transmission EELS, in which the kinetic energies are typically 100 to 300 keV and the incident electrons pass entirely through the material sample. Usually this occurs in a transmission electron microscope (TEM), and especially in a scanning transmission electron microscope (STEM).

In a STEM, probe-forming optics concentrate the illumination on the sample in a small probe The half-convergence angle of such probe is a balance between the desire to limit this angle, in order to limit the optical aberrations that worsen the size of the probe, and the desire to maximize this angle, in order to maximize the current in the probe and to minimize the blur due to wave diffraction effects. Typically, the probe size can be as small as 2 Å and the semi-convergence angle as large as 10 mrad in STEM microscopes that do not have aberration correctors, and the probe size can be as small as 0.5 Å and the semi-convergence angle as large as 40 mrad in STEM microscopes that have aberration correctors.

Usually in a STEM, since the specimen is rather thin, the major part of the electrons in the probe do not interact with the specimen. Some electrons in the probe may elastically scatter on the specimen (without losing energy) thus experiencing a noticeable change of direction. Other electrons may inelastically scatter on the specimen (without significant change of direction) thus experiencing a noticeable energy loss. A small part of the electrons may experience a plurality of interactions, elastic as well as inelastic.

The distribution of scattering angles can be observed in the back-focal plane of the first image forming lens (usually the objective lens). In this plane, all electrons which exit the specimen in a specific direction are, irrespective of their position at the specimen, focused in a single point. This two-dimensional image of the distribution of exit angles is called the diffraction pattern. The lenses downstream of the objective lens can be configured to transfer this pattern to some detector at the end of the microscope and to form at this detector an enlarged image of the diffraction pattern ('diffraction configuration'). Alternatively, on some types of electron microscopes, these lenses may also be configured to form at this detector an enlarged image of the specimen ('imaging configuration'). Such detector can be, for example, a viewing screen, or a pixelated image detector, or, as in the present invention, an EELS spectrometer. When the EELS spectrometer is used, the lenses of the microscope are usually in the diffraction configuration, because then the entrance aperture of the spectrometer selects a well-defined cone of exit angles, and this facilitates a good quantitative interpretation of the EELS signal.

The electrons that did not scatter elastically will exit the specimen at approximately the same angle as they entered. This part is visible in the diffraction pattern as a bright disc in the exiting beam and is called the bright-field (BF) beam or BF disc. The semi-angle of the BF beam is essentially equal to the semi-convergence angle of the probe. The electrons that did scatter elastically can have a change of direction up to ~100 mrad. This part is visible as a low-intensity halo around the BF disc and is called the dark-field (DF) beam or DF disc. Both the BF and DF beam contain electrons that experienced energy loss and thus carry EELS information, and this fraction of electrons is essentially the same in the BF and DF beam. Of course, because of the much higher intensity of the BF beam, in absolute numbers, most of the EELS information is carried by the BF beam. Therefore, in order to have high EELS signal, it is desirable that the optics between the specimen and the EELS spectrometer is set such that the EELS spectrometer captures at least the full BF beam that exits the specimen. This means that it is desirable that the EELS spectrometer captures at least a cone of electrons exiting the specimen equal in size to the cone of the electrons in the illuminating probe. Traditionally, EELS is done on electrons with specimen-exit-angles and energy losses which are not difficult for the TEM to transfer properly from the back focal plane of the objective lens to the EELS spectrometer. Traditional conditions are, for example, beam energy E0~200 keV, energy loss E~1000 eV, energy resolution ΔE~0.2 eV, and filter collection angle corresponding to α~10 mrad at the specimen. However, recent years have shown an increased interest of EELS beyond the traditional ranges.

In so called low-high tension (low-HT) EELS a smaller beam energy E0~60-100 keV may be used. One benefit of low HT is that the illuminating beam generally creates less damage in the specimen. Another benefit of lower HT is that the energy resolution in EELS is better, first because the energy resolution scales with the beam energy, and second because the lower energy of the beam leads to less cross-talk between the pixels in the EELS detector. This non-traditional form of EELS leads to a larger energy loss (E) compared to the beam energy (E0) than encountered before and this poses new demands on the relative range E/E0 of electron energies that can be transferred properly by the microscope from the diffraction plane to the EELS spectrometer. Another development that leads to an increase of this range E/E0 is the development of EELS spectrometers that can handle enhanced energy ranges (see, for example, U.S. Pat. No. 9,978,561B2 and U.S. Ser. No. 10/559,448B2 by the present inventor), Such extremely large energy range will enable study of deep core-losses such as, for example, Si—K (1832 eV), Sn-L (3860 eV), W-L (10 keV). Note that, especially for these deep core-losses, which have generally a weak signal, it is beneficial for good signal and for good quantification that these signals are collected with large collection angles.

In so-called probe corrected EELS a larger probe-convergence angle up to 40 mrad is used, and consequently a larger filter collection angle α at the specimen up to 40 mrad is desirable.

In so called ultra-high resolution (UHR) EELS, an improved energy resolution ΔE~0.02 eV or better is employed. Contrary to traditional EELS, where all EELS signals originate in electrons in the beam interacting with electrons in the specimen, in UHR EELS, some signals can originate in electrons in the beam interacting with nucleons in the specimen. Since nucleons are much heavier than electrons, these electrons that interact with nucleons are generally scattered too much higher angles. Therefore, for these signals, it is desirable for UHR EELS to operate with filter collection angle α~10-100 mrad at the specimen. Also in this case, it is beneficial for good signal and for good quantification that these signals are collected with large collection angles.

Larger collection angles require lower magnification (down to 10 ... 100 times) from the back focal plane of the objective lens to the EELS spectrometer, as the entrance aperture of the spectrometer is limited in size. This limitation is set by the optical aberrations of the EELS spectrometer which, when the electrons travel too far off-axis (for example more than 3 mm), create blur at the EELS detector. Such blur compromises the energy resolution of the spectrometer. Since in the TEM and STEM, the lenses downstream of the specimen are designed and optimized for maximum magnification (typical 100,000 ... 1,000,000 from specimen to detector), such low magnification makes that these lenses are used outside the range in which they perform with minimal aberrations, and that can give aberrations and distortions in the EELS spectrum, especially when it is combined with large E/E0 and/or improved energy resolution.

It has turned out that, especially for very large collection angle (which is equivalent to very low magnification of the TEM imaging system) the traditional optics of the imaging system of the TEM hampers the EELS performance. It is therefore an object of the invention to provide an improved transmission charged particle microscope.

SUMMARY OF THE INVENTION

To this end, the invention provides a transmission charged particle microscope as defined in claim 1. The invention relates to a transmission charged particle microscope comprising a charged particle beam source for emitting a charged particle beam, a sample holder for holding a sample, an illuminator for directing the charged particle beam emitted from the charged particle beam source onto the sample, and a control unit for controlling operations of the transmission charged particle microscope.

The transmission charged particle microscope comprises a charged particle beam source for emitting a charged particle beam, a sample holder for holding a sample, and an illuminator for directing the charged particle beam emitted from the charged particle beam source onto the sample. Furthermore, the transmission charged particle microscope comprises an Electron Energy-Loss Spectroscopy (EELS) detector. In between the sample and the EELS detector, a projecting system is provided for forming and imaging a diffraction pattern of the sample at a first magnification. As described above, the lenses in the projecting system can be set in diffraction configuration, thus forming an enlarged image of the diffraction pattern at the detector of said first magnification, or they can be set in image configuration, thus forming an enlarged image of the specimen at the detector. Typically, when the projecting system consists of a number of lenses, there will be a number of intermediate images of the specimen and a number of intermediate images of the diffraction pattern in the projector system. In diffraction configuration, the intermediate images of the diffraction pattern often are each of increasing size and the final diffraction pattern at the detector is of largest size and having said first magnification. At the same time, also in diffraction configuration, the intermediate images of the specimen are of decreasing size, until the last image of the specimen which is usually somewhere just after the last lens in the projector column, which has the smallest size. Because it is very small, this last image is usually considered as a point and this point is called the last cross-over. On some types of electron microscopes, the projector system may also be switched to imaging configuration. In such imaging configuration, the intermediate images of the specimen often are each of increasing size and the final specimen image at the detector is of largest size. At the same time, also in imaging configuration, the intermediate images of the diffraction pattern are of decreasing size, until the last image of the diffraction pattern, which is usually somewhere just after the last lens in the projector column, and which has the smallest size. Because it is very small, this last diffraction pattern can be considered as a point and this point is called the last cross-over. Often the last cross-over is simply referred to as the cross-over. It should be noted that the present invention applies as well to microscopes with projector systems which can only be operated in diffraction configuration and microscopes with projector systems which can be operated in diffraction configuration as well as in imaging configuration.

As defined herein, said projecting system comprises at least a final projector lens, which is an imaging lens that is arranged for forming an image of the diffraction pattern of the sample. The projecting system is arranged for providing the desired magnification, for providing focus of said diffraction pattern, and for establishing the cross-over at a desired position. This normally requires a total of at least three imaging lenses, each attributing to either one of the above demands of magnification, focus and cross-over position. The projecting system may comprise, in an embodiment, a diffraction lens, an intermediate lens, a first projector lens and a second projector lens. In an embodiment, the final projector lens as defined herein is formed by said second projector lens. The naming of these lenses reflects their main function in traditional TEM.

The EELS detector may comprise a dispersive device, an additional projecting system, and a detecting system comprising, for example, a pixel array of charged particle detector elements. Said dispersive device is arranged for dispersing the electrons according to their energy loss, and said additional projecting system is arranged for enlarging and imaging said dispersed electrons on said detecting system. Specifically, the dispersive device creates an image of the cross-over at an (intermediate) plane (the spectrum plane) such that electrons of different energy losses form images of the cross-over at different positions in the spectrum plane.

It may be noted that, at the spectrum plane, the dispersive device only needs to focus the image of the cross-over in the dispersive direction. It is not needed to focus this image in the non-dispersive direction because such defocus in the non-dispersive direction does not affect energy resolution. Usually, some amount of defocus in the non-dispersive direction at the spectrum plane is intentionally created, in order as to not concentrate the total intensity at a certain energy loss value in a single pixel on the detector, but instead in a certain row of pixels (or in one or more elongated pixels). Therefore, the image at the detector is not as much a line of intensities where the intensity at each point represents the total intensity at a certain energy loss, but more a rectangle of intensities where the intensity, integrated over a certain row, represents the total intensity at a certain energy.

As described above, the cross-over is very small and can be approximated as a point. In this approximation, and if the dispersive device would be free of optical imperfections, the energy resolution in the spectrum plane would be infinitely perfect. However, if the projector system introduces artefacts in the cross-over (for example, because of spherical or chromatic aberrations in its lenses), the cross-over is blurred to a finite size, and its blurred image in the spectrum plane compromises the energy resolution.

The transmission charged particle microscope as defined herein comprises a control unit for controlling operations of the transmission charged particle microscope. As defined herein, the transmission charged particle microscope is arranged for operating in at least two modes that substantially yield said first magnification of the diffraction pattern whilst keeping said diffraction pattern substantially in focus and whilst keeping said cross-over substantially at some desired position. The control unit may be arranged for switching between these modes, and it is conceivable that a user of the transmission charged particle microscope may set the desired mode by means of a graphical user interface, for example. Other ways of setting these modes are conceivable as well.

As defined herein, the at least two modes comprise at least a first mode having first settings of said final projector lens, and at least a second mode having second settings of said final projector lens. The second settings differ substantially from the first settings. The first and second settings relate to excitation settings of the final projector lens.

It is noted that the projecting system as defined herein comprises a final projecting lens. The projecting system may, of course, comprise additional projector lenses, in particular provided upstream of the final projector lens, in order to form an image of the diffraction pattern. Additionally, it is conceivable that one or more further projector lenses are provided further downstream of the final projector lens, although in view of the present disclosure the final projector lens is in principle a true final lens of the projecting system in at least one of the two modes. That means that the final projecting lens is arranged for forming and imaging a diffraction pattern of the sample at a first magnification in at least one of the at least two modes.

With the two modes of the projecting system of the transmission charged particle microscope as defined herein, it is possible to transfer faithfully the beam from the scattering plane to the EELS spectrometer. This is not only true for the traditional ranges of collection angles and energy losses (i.e. traditional EELS), but also for very high collection angles, also in combination with high energy losses ($E/E0>2\%$) or in combination with ultimate energy resolution. By allowing a switch between a first setting and a second setting of the projector lens, whilst keeping the same first magnification of the diffraction pattern of the detector, it is possible to optimize the projecting system for these different modes, which may be different EELS modes as described above. Thus, with the charged particle microscope as defined herein it becomes possible, by changing excitation settings of the final projector lens, to optimize the different modes differently. This may be done with respect to chromatic aberration, for example, or with respect to higher order aberrations. With this, the object of the invention is achieved.

It is noted that the use of two modes, each having different settings for the final projector lense whilst keeping the same first magnification, is different from the way of how EELS is implemented and performed on prior art TEMs or STEMs. In prior art TEMs or STEMs there is only a single setting of the imaging lenses for each magnification of the diffraction pattern. Hence, the prior art TEMs or STEMs do not offer a range of modes for a given magnification. Further embodiments and their advantages will be described below.

In an embodiment, said first settings comprise that said final projector lens is substantially enabled. This allows the crossover-forming rays to be brought close to the axis in the lenses upstream of the final projector lens, with which spherical aberration of the projecting system may be reduced. This is in particular beneficial for use with large acceptance angles at ultimate energy resolution where the image at the cross-over should have as little blur as possible (in order to reach the ultimate energy resolution). In an embodiment, said first mode thus comprises an ultra-high resolution EELS mode.

In an embodiment, said second settings comprise that said final projector lens is substantially disabled. Advantageously, this allows the distance between the final crossover and the final projector lens to be changed. This may require, in an embodiment, that lens excitations and/or settings of additional lenses upstream of said final projector lens are to be changed as well. In any event, increasing the distance between the final crossover and the final projector lens reduces experimental artefacts that are visible in low-HT (extremely large energy loss) EELS, which are mainly the result from chromatic aberration of the projecting system. In an embodiment, said second mode thus comprises a low-HT EELS mode.

In an embodiment, said projecting system comprises an objective lens for forming a diffraction pattern of the sample at a back focal plane.

In an embodiment, said first magnification corresponds to an effective focal distance of said projecting system of approximately 100 mm or less. Here, effective focal distance is defined as the focal distance of the first imaging lens multiplied by the magnification from the back-focal plane of this lens to the detector.

In an embodiment, said projecting system is arranged for bringing said diffraction pattern in focus at a diffraction pattern entrance aperture. The diffraction pattern entrance aperture may be an entrance part of a dispersing device, or be provided upstream of a dispersing device.

According to an aspect, a method of operating a transmission electron microscope is provided, wherein said method comprises the steps of: providing a sample; operating said transmission electron microscope in said first mode on said sample; bringing said transmission electron microscope to said second mode by changing said projector system settings from said first settings to said second settings; and operating said transmission electron microscope in said second mode on said same sample.

As defined herein, the transmission charged particle microscope is arranged for operating in at least two modes that substantially yield said first magnification whilst keeping said diffraction pattern substantially in focus. The user may switch between these modes by using a computer or other input device. It is furthermore conceivable that a control unit is used for switching from the first mode to the second mode.

As defined herein, the at least two modes comprise at least a first mode having first settings of said final projector lens, and at least a second mode having second settings of said final projector lens. The second settings differ substantially from the first settings. The first and second settings relate to excitation settings of the final projector lens.

By changing the settings of the final projector lens it is possible, in an embodiment, to record different EELS spectra. It is conceivable that the method comprises the step of recording a first EELS spectrum of said sample in said first mode and recording a second EELS spectrum of said sample in said second mode. The first EELS spectrum differs from the second EELS spectrum.

In an embodiment, the method comprises the step of switching said final projector lens from essentially "on" to essentially "off".

Further embodiments of the method have been discussed above with respect to the transmission charged particle microscope.

BRIEF DESCRIPTION OF THE DRAWINGS

The device and method as disclosed herein will now be elucidated in more detail on the basis of exemplary embodiments and the accompanying schematic drawings, in which.

In the Figures, where pertinent, corresponding parts are indicated using corresponding reference symbols. It should be noted that, in general, the Figures are not to scale.

DETAILED DESCRIPTION OF EMBODIMENTS

Figure 1:
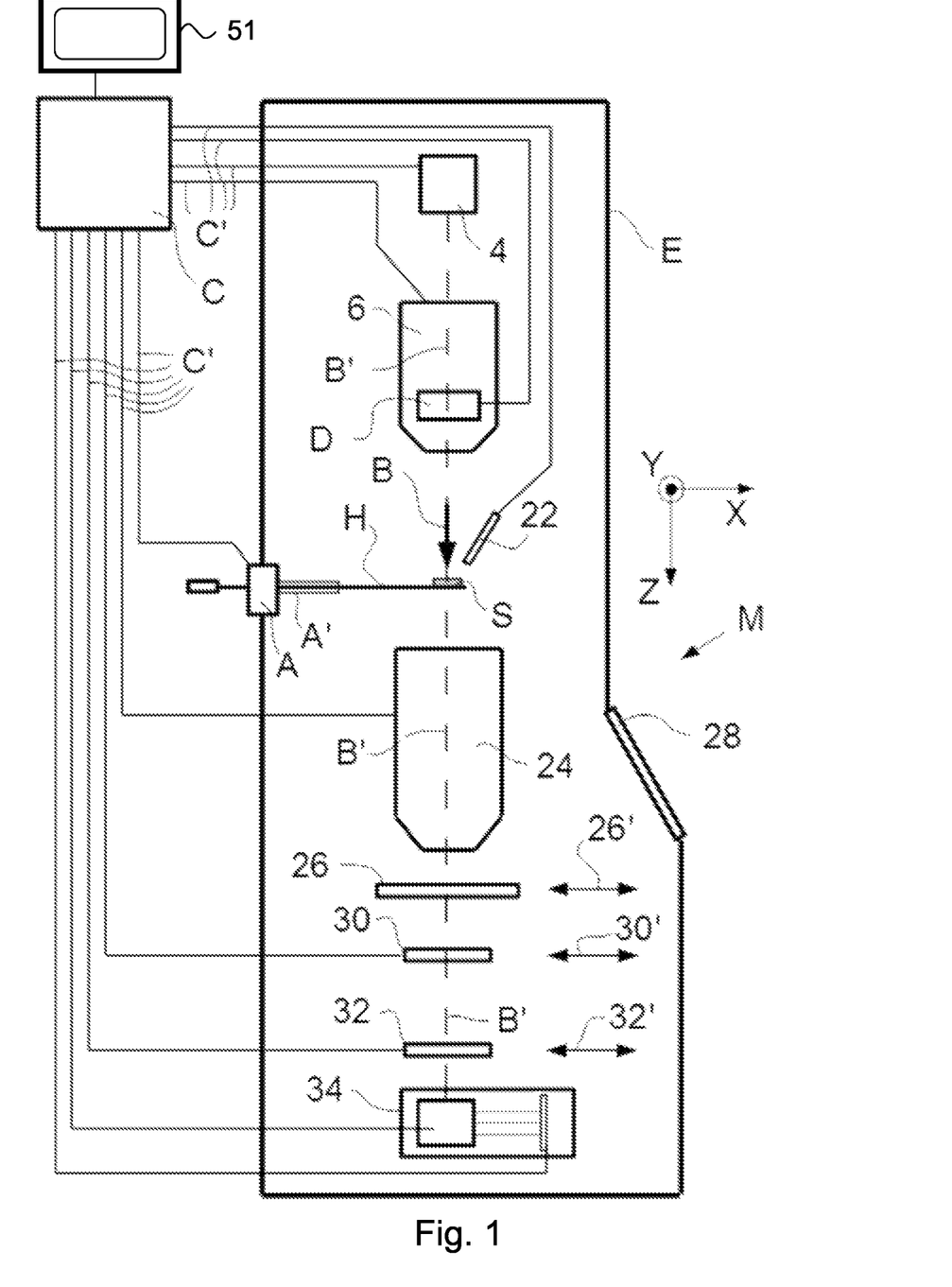
FIG. 1 shows a longitudinal cross-sectional view of a charged-particle microscope.

FIG. 1 is a highly schematic depiction of an embodiment of a transmission charged particle microscope M, which, in this case, is a TEM/STEM (though, in the context of the present disclosure, it could just as validly be an ion-based or proton microscope, for example). In FIG. 1, within a vacuum enclosure E, an electron source 4 (such as a Schottky emitter, for example) produces a beam (B) of electrons that traverse an electron-optical illuminator 6, serving to direct/focus them onto a chosen part of a sample S (which may, for example, be (locally) thinned/planarized). This illuminator 6 has an electron-optical axis B', and will generally comprise a variety of electrostatic/magnetic lenses, (scan) deflector(s) D, correctors (such as stigmators), etc.; typically, it can also comprise a condenser system (the whole of item 6 is sometimes referred to as "a condenser system").

The sample S is held on a sample holder H. As here illustrated, part of this holder H (inside enclosure E) is mounted in a cradle A' that can be positioned/moved in multiple degrees of freedom by a positioning device (stage) A; for example, the cradle A' may (inter alia) be displaceable in the X, Y and Z directions (see the depicted Cartesian coordinate system), and may be rotated about a longitudinal axis parallel to X. Such movement allows different parts of the sample S to be irradiated/imaged/inspected by the electron beam traveling along axis B' (and/or allows scanning motion to be performed as an alternative to beam scanning [using deflector(s) D], and/or allows selected parts of the sample S to be machined by a (non-depicted) focused ion beam, for example).

The (focused) electron beam B traveling along axis B' will interact with the sample S in such a manner as to cause various types of "stimulated" radiation to emanate from the sample S, including (for example) secondary electrons, backscattered electrons, X-rays and optical radiation (cathodoluminescence). If desired, one or more of these radiation types can be detected with the aid of detector 22, which might be a combined scintillator/photomultiplier or EDX (Energy-Dispersive X-Ray Spectroscopy) module, for instance; in such a case, an image could be constructed using basically the same principle as in a SEM. However, alternatively or supplementally, one can study electrons that traverse (pass through) the sample S, emerge (emanate) from it and continue to propagate (substantially, though generally with some deflection/scattering) along axis B'. Such a transmitted electron flux enters an imaging system (combined objective/projection lens) 24, which will generally comprise a variety of electrostatic/magnetic lenses, deflectors, correctors (such as stigmators), etc.

In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image (or diffractogram) of (part of) the sample S will be formed by imaging system 24 on screen 26, and this may be viewed through viewing port 28 located in a suitable part of a wall of enclosure E. The retraction mechanism for screen 26 may, for example, be mechanical and/or electrical in nature, and is not depicted here.

As an alternative to viewing an image on screen 26, one can instead make use of the fact that the depth of focus of the electron flux emerging from imaging system 24 is generally quite large (e.g. of the order of 1 meter). Consequently, various types of sensing device/analysis apparatus can be used downstream of screen 26, such as:

TEM camera 30. At camera 30, the electron flux can form a static image (or diffractogram) that can be processed by controller C and displayed on a display device (not depicted), such as a flat panel display, for example. When not required, camera 30 can be retracted/withdrawn (as schematically indicated by arrows 30') so as to get it out of the way of axis B'.

STEM recorder 32. An output from recorder 32 can be recorded as a function of (X,Y) scanning position of the beam B on the sample S, and an image can be constructed that is a "map" of output from recorder 32 as a function of X,Y. Recorder 32 can comprise a single pixel with a diameter of e.g. 20 mm, as opposed to the matrix of pixels characteristically present in camera 30. Moreover, recorder 32 will generally have a much higher acquisition rate (e.g. $10^6$ points per second) than camera 30 (e.g. $10^2$ images per second). Once again, when not required, recorder 32 can be retracted/withdrawn (as schematically indicated by arrows 32') so as to get it out of the way of axis B' (although such retraction would not be a necessity in the case of a donut-shaped annular dark field recorder 32, for example; in such a recorder, a central hole would allow beam passage when the recorder was not in use).

As an alternative to imaging using camera 30 or recorder 32, one can also invoke spectroscopic apparatus 34, which could be an EELS module, for example.

It should be noted that the order/location of items 30, 32 and 34 is not strict, and many possible variations are conceivable. For example, spectroscopic apparatus 34 can also be integrated into the imaging system 24.

Note that the controller (which may be a combined controller and processor) C is connected to various illustrated components via control lines (buses) C'. Controller can be connected to a computer screen 51, which may be provided with a user interface (UI). This controller C can provide a variety of functions, such as synchronizing actions, providing setpoints, processing signals, performing calculations, and displaying messages/information on a display device (not depicted). It will be understood that the (schematically depicted) controller C may be (partially) inside or outside the enclosure E, and may have a unitary or composite structure, as desired. The skilled artisan will understand that the interior of the enclosure E does not have to be kept at a strict vacuum; for example, in a so-called "Environmental TEM/STEM", a background atmosphere of a given gas is deliberately introduced/maintained within the enclosure E. The skilled artisan will also understand that, in practice, it may be advantageous to confine the volume of enclosure E so that, where possible, it essentially hugs the axis B', taking the form of a small tube (e.g. of the order of 1 cm in diameter) through which the employed electron beam passes, but widening out to accommodate structures such as the source 4, sample holder H, screen 26, camera 30, recorder 32, spectroscopic apparatus 34, etc.

Figure 2:
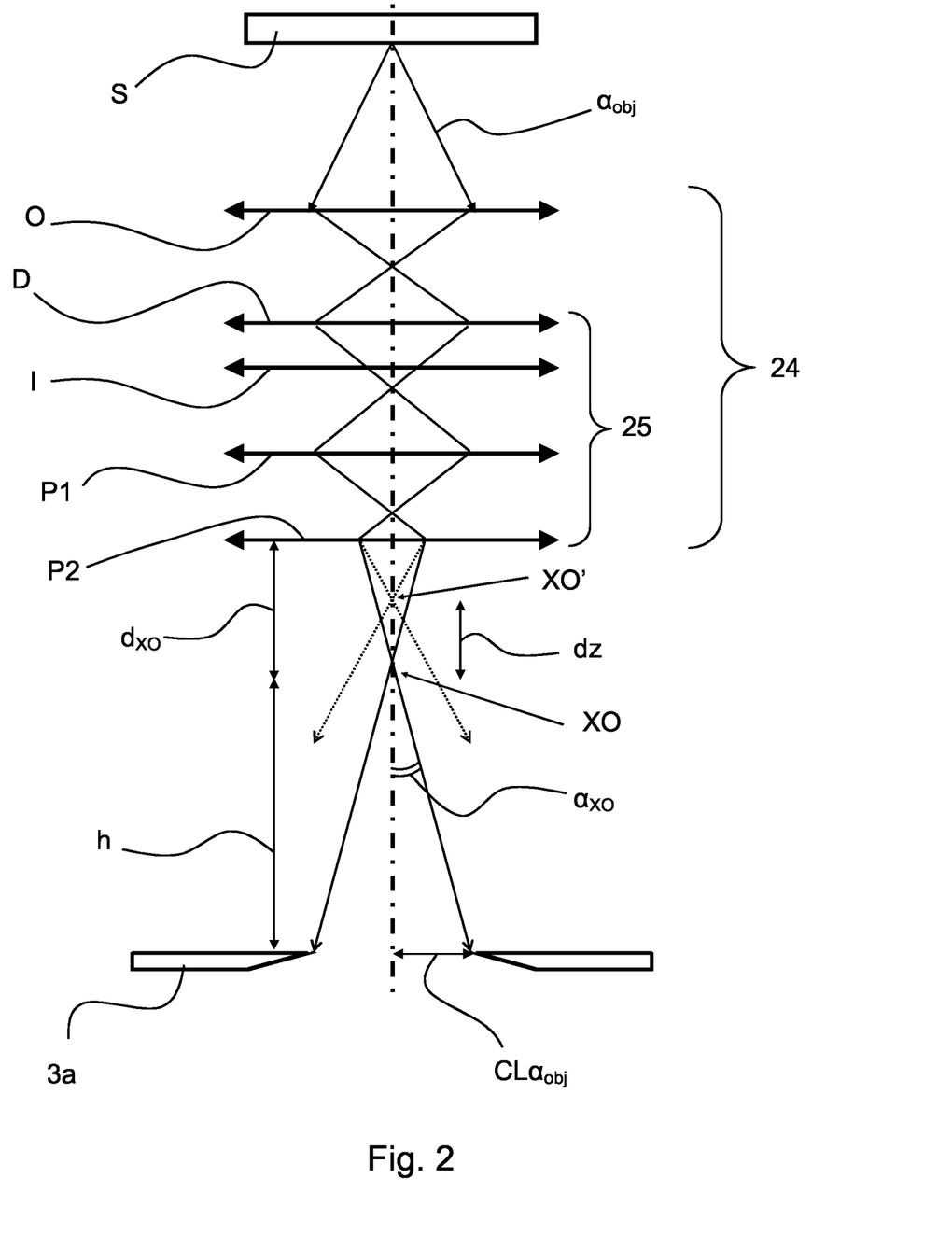
FIG. 2 shows an enlarged longitudinal cross-sectional view of projecting system as defined herein.

FIG. 2 shows a more detailed embodiment of the imaging system 24 as defined herein. The imaging system 24 is provided in between the sample S and an entrance aperture 3a of a dispersing device 3 (see also FIG. 3). The imaging system 24 shown comprises an objective lens O and a projecting system 25. The projecting system 25 comprises a number of different lenses, and in the embodiment shown a total of four lenses. These lenses are, subsequently, a diffraction lens D, an intermediate lens I, a first projector lens P1 and a second projector lens P2. The second projector lens P2 constitutes the final projector lens P2 as defined herein. In between the objective lens and the projecting system 25, an optional spherical and/or chromatic aberration corrector (not shown) may be placed, as known to those skilled in the art.

Figure 3:
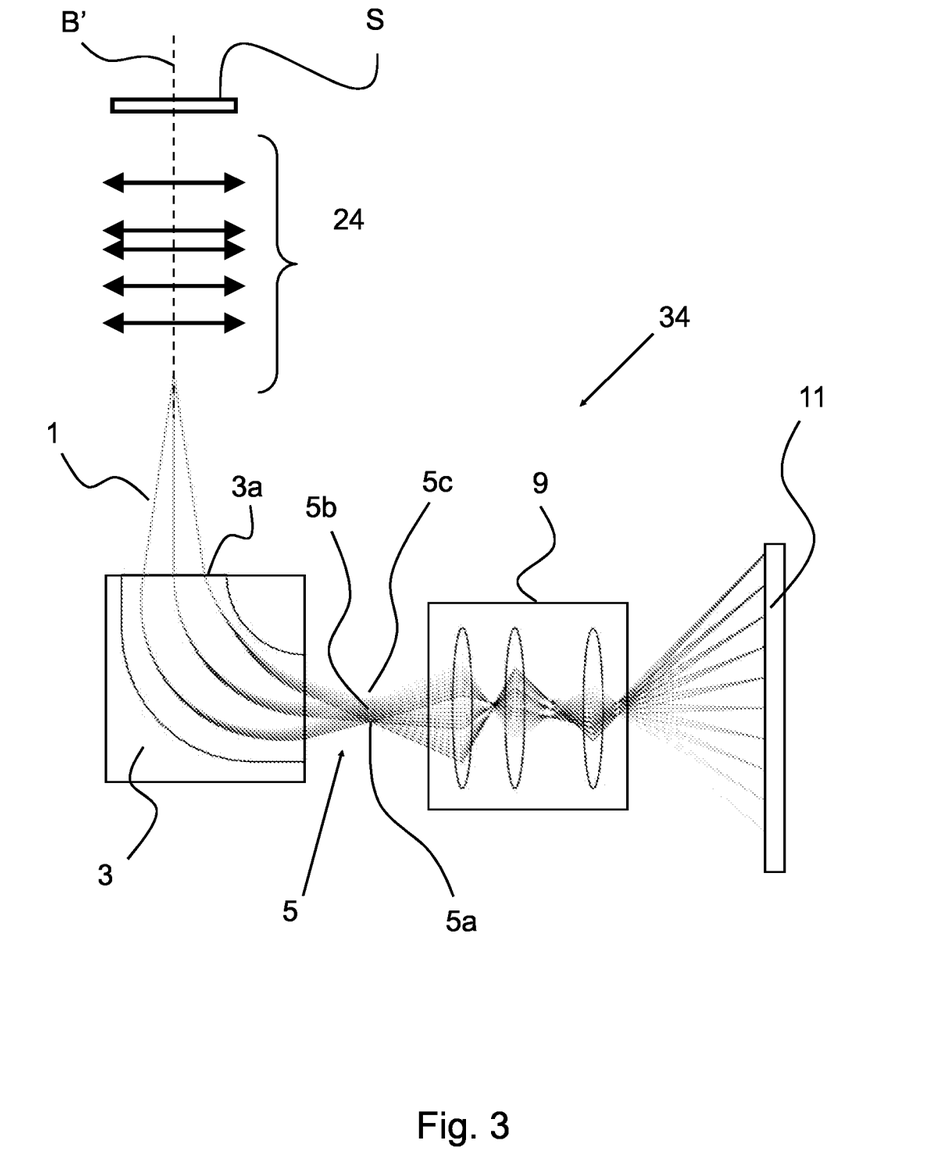
FIG. 3 shows an enlarged cross-sectional view of a spectroscopic apparatus including the projecting system.

Turning now to FIG. 3, this shows an enlarged and more detailed view of an embodiment of the spectroscopic apparatus 34 in FIG. 1. In FIG. 3. a flux 1 of electrons (which has passed through sample S and imaging system 24) is shown propagating along electron-optical axis B'. This flux 1 enters a dispersing device 3 ("electron prism"), where it is dispersed (fanned out) into an energy-resolved (energy-differentiated) array 5 of spectral sub-beams, which are distributed along a dispersion direction; for illustration purposes, three of these sub-beams are labelled 5a, 5b and 5c in FIG. 3.

Downstream of the dispersing device 3, the array 5 of sub-beams encounters post-dispersion electron optics 9, where it is magnified/focused, for example, and ultimately directed/projected onto detector 11. The post-dispersion optics may comprise round lenses and/or quadrupole lenses. The detector 11 may comprise an assembly of sub-detectors arranged along the dispersion direction, with different sub-detectors being adjustable so as to have different detection sensitivities. It is noted that other detector configurations for measuring EELS spectra are known to those skilled in the art and are applicable in the method and device as disclosed herein as well. The method is in principle not limited to the use of a specific detector.

Figure 4:
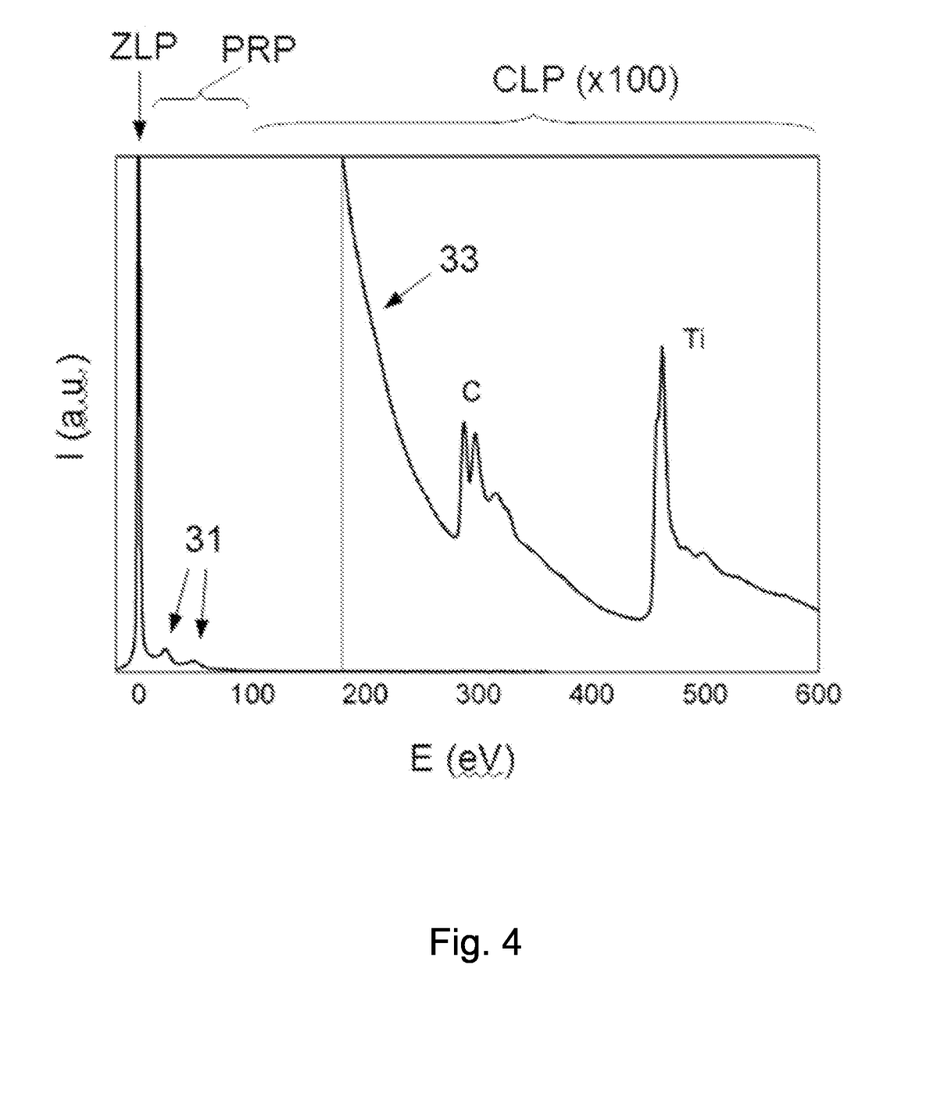
FIG. 4 shows an example of an EELS spectrum.

FIG. 4 shows an example of an EELS spectrum. The Figure renders intensity I (in arbitrary units, a.u.) as a function of energy-loss E (in eV) for electrons that have traversed a sample containing Carbon and Titanium. From left to right, the main features of the spectrum are:

A Zero-Loss Peak ZLP, representing electrons that traverse the sample without undergoing inelastic scattering therein;

A Plasmon Resonance Peak component/section PRP, a relatively broad series of peaks/shoulders associated with single or multiple scattering of electrons on plasmons in the specimen. This typically extends from about 0 to 50 eV, although there is no strict definition of its upper limit. It is characterized by peaks/shoulders resulting from excitations of collective vibrations of the valence electrons in the sample, such as peaks 31. Note that the PRP component usually has a significantly lower intensity than the ZLP.

A Core Loss Peak component/section CLP. This typically starts at about 50 eV (after the PRP component), although there is no strict definition of its lower limit. It is typically of such a low intensity relative to the ZLP/PRP components that, as rendered in FIG. 4, it is enlarged by a multiplication factor (e.g. 100) to improve visibility of its details. As can be seen, it contains (clusters of) peaks/shoulders that can be associated with certain chemical elements (such as C and Ti, in the current example), seated on top of a substantial background contribution 33. The EELS spectrum shown in FIG. 4 can be measured in ways known to those skilled in the art, using the device and set up as discussed with reference to FIGS. 1 to 3.

As discussed in the introduction, EELS is traditionally done on electrons with specimen-exit-angles and energy losses which are not difficult for the TEM to transfer properly from the back focal plane of the objective lens to the EELS spectrometer. However, low-HT (probe corrected) EELS and ultra-high resolution (UHR) EELS require large collection angles, which in turn requires low magnification. Such low magnification can give artefacts in the EELS spectrum, especially when it is combined with large E/E0 and/or improved energy resolution.

Low-HT (Probe Corrected EELS)

Figure 5A:
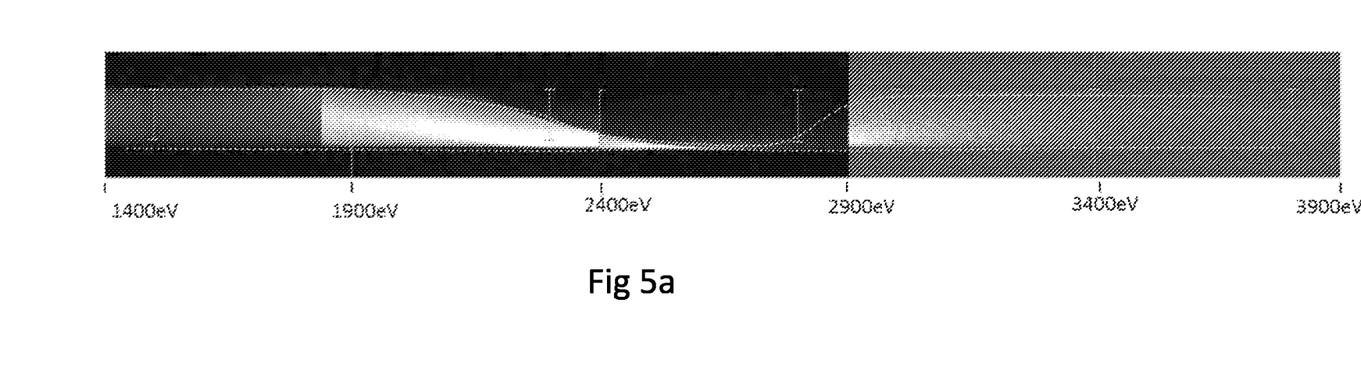
FIG. 5a shows an image on the EELS detector of an EELS spectrum according to the prior art.
Figure 5B:
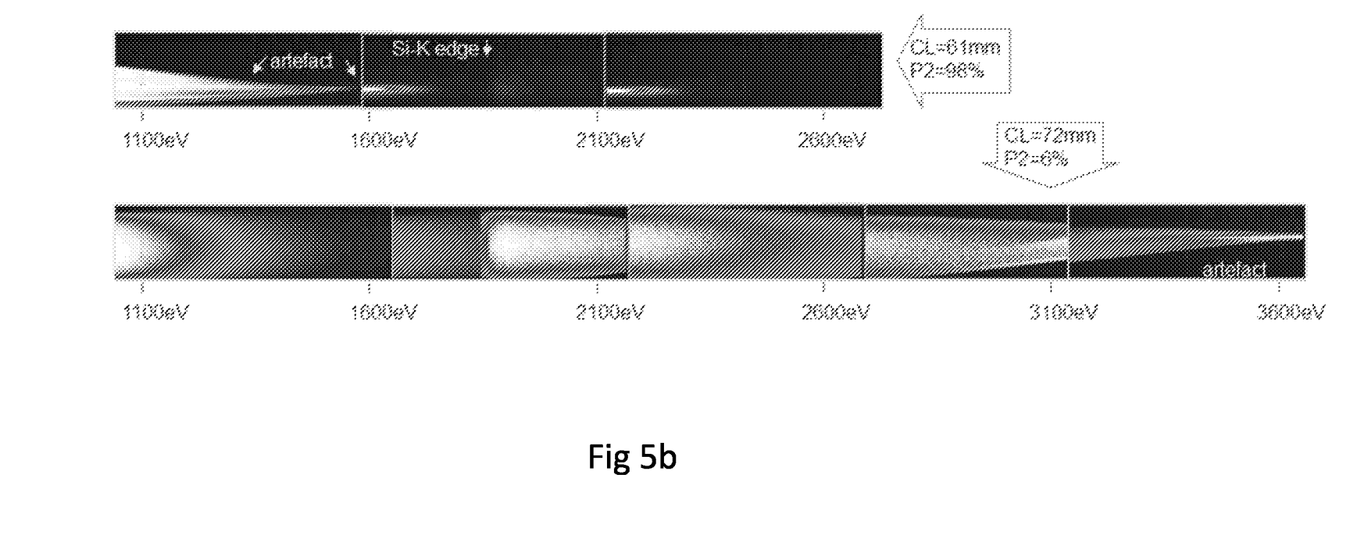
FIG. 5b shows an image on the EELS detector of an EELS spectrum according to the prior art, and according to a mode of the invention.

FIG. 2 and FIG. 5a-5b discuss the aberrations that occur in low-HT (probe corrected) EELS, and possible settings for a transmission charged particle microscope to overcome these aberrations.

FIG. 5a shows an image of an EELS spectrum of a Si sample taken in so called low-HT (probe corrected) EELS mode. Here, a larger energy loss (E) compared to the beam energy (HT) is encountered, such as E/E0=1-4%. The image of the EELS spectrum shown is a sliced image of three sub-images each with different exposure time because of the large energy range and the large intensity range. The EELS spectrum exhibits a strange shrinking of height in the non-dispersive direction in the region of 2400 eV-2900 eV, and a strange bump of increased intensity in the range of 2200 eV-2600 eV. It was found that the large collection angles require low magnification from scattering plane (that is, the back focal plane of the objective lens) to the EELS spectrometer, as the entrance aperture of the spectrometer is limited in size. Such low magnification can give artefacts in the EELS spectrum, especially when it is combined with large E/E0 as shown in FIG. 5a. The artefacts make that the EELS signal can no longer be quantified reliably.

Now turning back to FIG. 2, a potential cause for these artefacts will be indicated. In EELS, the diffraction pattern is imaged at the EELS spectrometer entrance aperture 3a. The magnification from objective back focal plane to entrance aperture 3a can be tuned such that the entrance aperture collects a specific radius of cone of electrons exiting the specimen. A typical choice is that this cone equals the cone of electrons that form the probe (then the aperture precisely captures the so-called 'bright-field disc'). The magnification from diffraction pattern to entrance aperture 3a is called the camera length (CL) and can be interpreted as the effective focal distance of the imaging system at the entrance aperture.

An image of the probe at the specimen is formed at a cross-over XO following the final projection lens P2. This cross-over is located about $d_{XO}$=3.5 mm below this last imaging lens P2. Due to the chromatic aberration of the imaging system, electrons with energy loss E will be focused somewhat above this cross-over XO (see dashed lines in FIG. 2, having modified cross-over XO'). The defocus distance dz is given by $dz=C_c^{(XO)} \cdot (E/E0)$, where $C_c^{(XO)}$ is the chromatic aberration at the XO plane. In first order, this $C_c^{(XO)}$ is related to the chromatic aberration at the specimen $C_c^{(spec)}$ as $C_c^{(XO)}=M^2 \cdot C_c^{(spec)}$ where M is the magnification from specimen to XO.

This magnification M can be calculated as follows. The angle at the specimen is $\alpha_{obj}$. From FIG. 2 it follows that, using a small angles approximation, the angle at the cross-over XO is equal to $\alpha_{XO}=CL\alpha_{obj}/h$. Hence, the angular magnification from the specimen S to the cross-over XO is $M_\alpha=\alpha_{XO}/\alpha_{obj}=CL/h$. The spatial magnification from the specimen S to the cross-over XO is $M=1/M_\alpha=h/CL$. Since $C_c^{(spec)}$ is dominated by the $C_c^{(obj)}$ of the objective lens, we approximate $C_c^{(XO)}=M^2 \cdot C_c^{(obj)}$. Combining these gives $dz=C_c^{(obj)} \cdot (h/CL)^2 \cdot (E/E0)$.

The first order approximation breaks down when dz gets that large that the XO shifts in the P2 lens. Full simulations show that as the energy loss E increases, the XO shifts upwards through the P2 lens, through the front focal plane (F.F.P.) of the P2 lens, and further upwards. When the energy loss is such that the XO is at the F.F.P. of the P2 lens, the electrons are exiting the P2 lens in a parallel way. Thus, at this energy loss, not only electrons with the usual scattering angles enter the spectrometer, but all electrons enter the spectrometer, irrespective of their scattering angle $\alpha_{obj}$. This additional signal pops up in the EELS spectrum as the bump in FIG. 5. At even higher energy losses, the electrons are again deflected away from the parallel beam and the bump disappears from the EELS spectrum. We can estimate that the EELS bump occurs when the chromatic defocus becomes equal to the distance between XO and P2 lens, $dz=d_{XO}$ (see FIG. 2). Thus the EELS bump starts at $$E = E_0 \cdot d_{XO}/C_c^{(obj)} \cdot (CL/h)^2 \qquad \text{(Equation 1)}$$

With $E_0$=120 keV, $d_{XO}$=3.5 mm, $C_c^{(obj)}$=2.0 mm (is chromatic aberration from objective lens plus image corrector, neglect contribution from other imaging lenses), CL=75 mm, h=690 mm, this estimate results in:

$$\Delta E = 120 \text{ kV} \cdot 3.5/2.0 \cdot (75/690)^2 = 2.5 \text{ keV} \qquad \text{(Equation 2)}$$

This is in good agreement with the experimental results shown in FIG. 5a.

Looking at Equation 1, there seem several options to push the EELS bump to higher energies, away from the region of energies of interest:

- Increase $E_0$, that is, going to higher high tension. This is not desirable for beam-sensitive specimens.
- Reduce $C_c^{(obj)}$, for example, by adding a Cc corrector. This is very expensive.
- Increase camera length CL. This is undesirable because it reduces the signal collected by the entrance aperture of the EELS spectrometer.
- Decrease the distance h between XO and spectrometer. This is undesirable because it increases the magnification from XO to spectrum plane, and, because of the finite size of the image at the XO, this deteriorates the resolution of the EELS spectrometer.
- Increase the distance $d_{XO}$ between the last lens and the XO. This is the approach according to the present invention.

The present invention teaches, in this example, to increase the distance $d_{XO}$ by reducing the excitation of the P2 lens, and in an embodiment by nearly switching the P2 lens off. This effectively makes that P1 becomes the last lens. FIG. 5 shows experimental proof that this is indeed a very effective solution, yielding an extremely large artefact-free EELS range of E/E0=3 keV/60 keV=5%. FIG. 5b shows images of EELS spectrum of Si sample at 60 kV, CL=65 mm, 5 mm entrance aperture (thus α≈35 mrad). These are spliced images of three and five sub-images each with different exposure time because of the large energy range and the large intensity range. The top of FIG. 5b shows a traditional set-up with P2-on, artefact starts around 1200 eV. The bottom of FIG. 5B shows a set-up according to the invention: P2-off pushes the artefact beyond 3000 eV.

Ultimate Energy Resolution EELS

Figure 6:
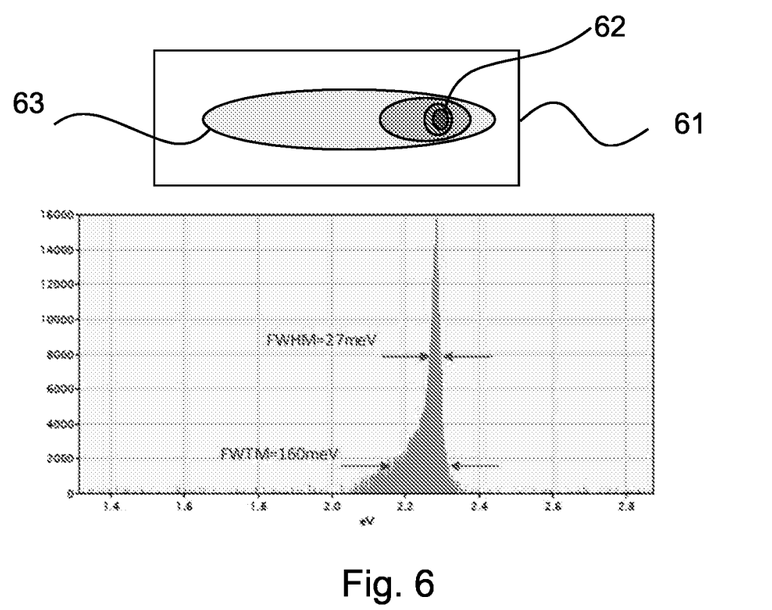
FIG. 6 shows an example of the Zero Loss Peak of an EELS spectrum according to the prior art.
Figure 7:
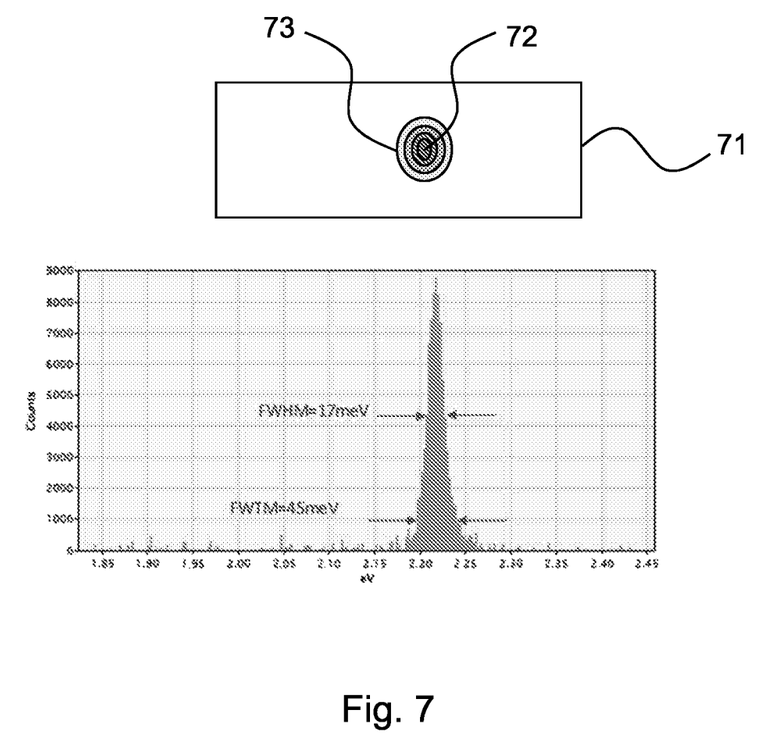
FIG. 7 shows an example of the Zero Loss Peak of an EELS spectrum obtained with the invention.
Figure 8A:
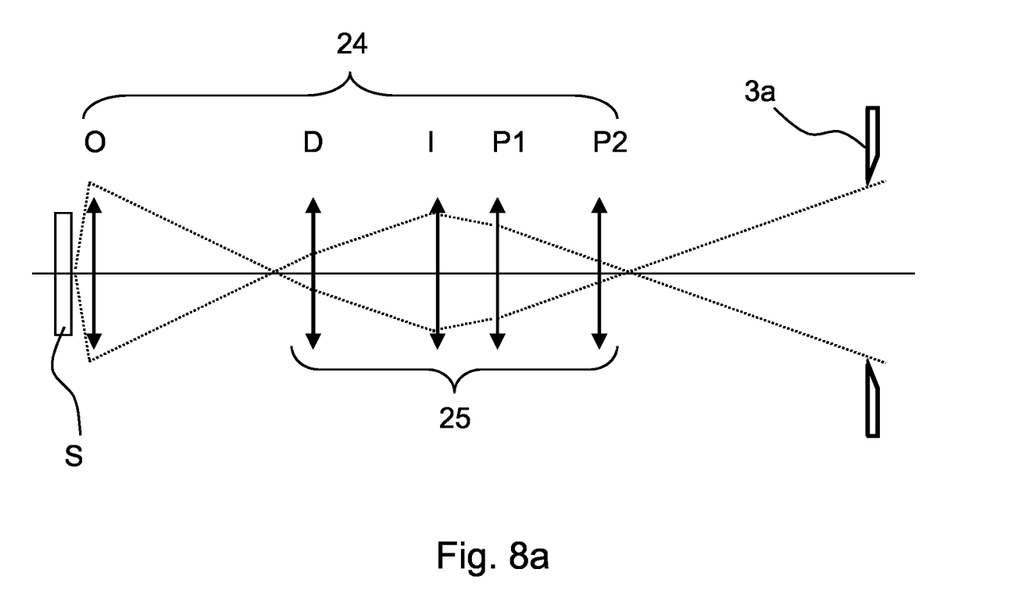
FIGS. 8a and 8b show the projecting system at different settings of the final projecting lens.
Figure 8B:
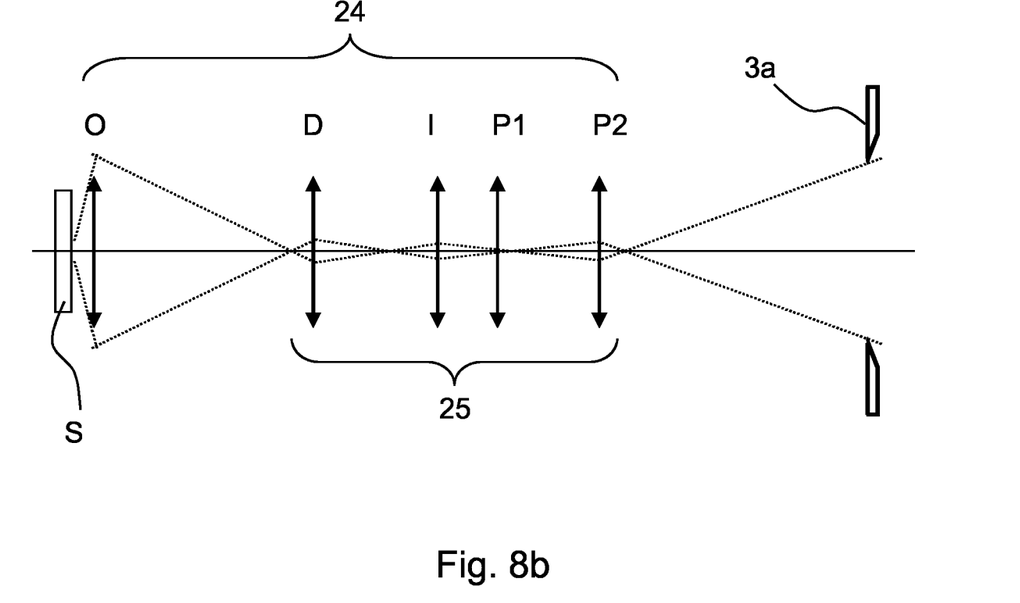

FIGS. 6-8 discuss the aberrations that occur in ultimate energy resolution EELS, and possible settings for a transmission charged particle microscope to overcome these aberrations.

The ultimate energy resolution that can be obtained in a TEM in general is about ΔE=15 meV at $E_0$=60 keV. Such resolution is only obtainable when the smallest entrance aperture of the spectrometer is used because of spectrometer aberrations. This smallest aperture is 1 mm. Therefore, the magnification from scattering plane to spectrometer entrance must be very small when a large range of scattering angles (α>20 mrad) has to be collected by the EELS spectrometer. Such very small magnification can cause aberrations that affect the ultimate energy resolution.

FIG. 6 schematically shows the zero loss peak 62 at CL=13 mm at high resolution as recorded on EELS detector 11, and the corresponding EELS spectrum obtained by integrating this image 61 vertically. Clearly, the energy resolution is blurred (see lines 62-63) by some aberration. It was found that the blur decreases when the camera length CL is increased (without changing anything else in the set-up). This indicates that the blur originates somewhere in the projection system of the TEM.

Part of the resolution loss at very low camera length is caused by the spherical aberration $C_c^{(obj)}$ of the imaging objective lens: This blurs the probe by $d_{spec}=\frac{1}{4}C_s^{(obj)}\alpha_{obj}^3$. As indicated above with respect to FIGS. 2 and 5a, the probe is imaged to the XO with a magnification M=h/CL, hence the blur at the XO is $d_{XO}=\frac{1}{4}C_s^{(obj)}\cdot\alpha_{obj}^3\cdot(h/CL)$. This can be translated to an energy blur using the apparent dispersion δ of the spectrometer at the XO. The corresponding resolution loss is $$\Delta E = 1/4 C_s^{(obj)} \cdot \alpha_{obj}^3 \cdot (h/CL)/\delta \quad \text{(Equation 3)}$$

FIG. 6 has been recorded with $C_s^{(obj)}$=1.3 mm, $\alpha_{obj}$=17 mrad, h=690 mm, CL=13 mm, δ=11 μm/eV at 60 kV, and this gives ΔE=8 meV. Clearly, the spherical aberration of the objective lens is significant but cannot explain the broadening observed in FIG. 6.

FIGS. 8a and 8b show two settings for the TEM imaging system that both transfer the diffraction pattern to the EELS detector with very low magnification, CL=13 mm. The first alternative has P2 almost off, the second alternative has P2 fully on. The second alternative has the main drawback that, in order to obtain a total low magnification, one or more of the intermediate lenses in the column must be de-magnifying in order to compensate for the large magnification of P2. This yields image-forming rays (not sketched in FIG. 8b) which are far off-axis in these intermediate lenses and these far off-axis rays yield correspondingly large aberrations at the image plane (in this case the EELS detector). Therefore, this second alternative is normally not used.

The first alternative which has P2 almost off is preferred because it does not suffer from image aberrations coming from the intermediate lenses. Furthermore, it has the benefit that it happens to perform very good at high E/E0, as discussed above with respect to FIG. 5 and FIG. 2.

In the setting with P2 almost off (FIG. 8a), the XO is essentially created and focused by the P1 lens. The quality of this focus is, apart from the above discussed contribution of $C_s^{(obj)}$, mainly determined by the spherical aberration of the P1 lens. A rough rule of thumb is that the spherical aberration of a lens is $C_s^{(P1\_XO)} \sim d_{im}^4/S^3$. In this set-up, the P1 lens has image distance $d_{im}$=80 mm and lens gap S=17 mm and this gives for $C_s^{(P1\_XO)}$=8·10³ mm; a full calculation gives $C_s^{(P1\_XO)}$=14.5·10³ mm at the XO position. We can calculate this back to the specimen as a spherical aberration at the specimen: $C^{(proj\_spec)}=C_s^{(proj\_XO)}/M^4$=0.002 mm using M=h/CL=53× as magnification from specimen to XO.

Clearly, the contribution of the projector system 25 $C_s^{(proj\_spec)}$=0.002 mm is much smaller than the contribution of the objective lens O $C_s^{(obj)}$=1.3 mm so it seems that it can be neglected.

However, it is important to realize that, in practice, due to mechanical shifts and tilts of the lenses, the beam can be off-axis by 1 . . . 3 mm at the entrance of the spectrometer 3a. This is normally corrected by applying a so-called 'diffraction shift' using the deflectors located between the objective lens O and the D-lens. This causes significant off-axis travel of the beam in the I and P1 lenses, equivalent to an angle at the objective of α=(1 . . . 3 mm)/CL=80 . . . 230 mrad. The precise effect of such off-axis travel is difficult to calculate but the skilled artisan will understand that this causes noticeable energy blur. This can be checked by repeating the EELS measurement using a setting in which the XO-forming rays are close to the axis The lower setting in FIG. 8b has P2 lens on, thus bringing the XO-forming rays (light in this figure) close to the axis. As a consequence, the spherical aberration of the projector system is relatively low; a full calculation gives $C_s^{(P1\_XO)}$=85 mm, which is 170× less than in the setting in FIG. 8a. FIG. 7 shows the EELS spectrum obtained in this mode (i.e. with P2 on). The blur is absent in the image 71 of FIG. 7, see lines 72-73.

From the above it follows that a transmission charged particle microscope is provided, wherein said transmission charged particle microscope is arranged for operating in at least two modes that substantially yield said first magnification whilst keeping said diffraction pattern substantially in focus, wherein said at least two modes comprise: a first mode having first settings of said final projector lens; and a second mode having second settings of said final projector lens. The first mode and the second mode are different EELS modes, in an embodiment. The first setting may comprise that the final projector lens P2 is substantially enabled, and corresponds for example to the situation as described above with respect to Ultimate Energy Resolution EELS. The second setting may comprise that the final projector lens P2 is substantially disabled, and corresponds for example to the situation as described above with respect to low-HT EELS. In the first setting, with the final projector lens P2 set to substantially enabled, a traditional EELS spectrum may be obtained as well.

It is noted that other settings of the imaging system 24 and/or the projecting system 25 may be changed in between the first mode and the second mode, as long as the magnification is substantially the same. The magnification used corresponds, in an embodiment, to an effective focal distance of said projecting system of approximately 100 mm or less.

The desired protection is determined by the appended claims.

What is claimed is:

1. A transmission charged particle microscope comprising:
    a charged particle beam source for emitting a charged particle beam;
    a sample holder for holding a sample;
    an illuminator for directing the charged particle beam emitted from the charged particle beam source onto the sample;
    a projecting system for forming and imaging a diffraction pattern of the sample at a first magnification, wherein said projecting system comprises at least a final projector lens;
    an Electron Energy-Loss Spectroscopy detector; and
    a control unit for controlling operations of the transmission charged particle microscope;
    wherein the transmission charged particle microscope is arranged for operating in at least two modes that substantially yield said first magnification whilst keeping said diffraction pattern substantially in focus, wherein said at least two modes comprise:
        a first mode having first settings of said final projector lens; and
        a second mode having second settings of said final projector lens.

2. Transmission charged particle microscope according to claim 1, wherein said first settings comprise said final projector lens being substantially enabled.

3. Transmission charged particle microscope according to claim 1, wherein said first mode comprises an ultra high resolution EELS mode.

4. Transmission charged particle microscope according to claim 1, wherein said second settings comprise that said final projector lens is substantially disabled.

5. Transmission charged particle microscope according to claim 1, wherein said second mode comprises a low-HT EELS mode.

6. Transmission charged particle microscope according to claim 1, wherein said projecting system comprises an objective lens for forming a diffraction pattern of the sample at a back focal plane.

7. Transmission charged particle microscope according to claim 1, wherein said first magnification corresponds to an effective focal distance of said projecting system of approximately 100 mm or less.

8. Transmission charged particle microscope according to claim 1, wherein said projecting system is arranged for bringing said diffraction pattern in focus at a diffraction pattern entrance aperture.

9. Transmission charged particle microscope according to claim 1, wherein said projecting system comprises a first projecting lens.

* * * * *